United States Patent
Park et al.

(10) Patent No.: US 10,043,678 B2
(45) Date of Patent: Aug. 7, 2018

(54) METAL FILM POLISHING SLURRY COMPOSITION, AND METHOD FOR REDUCING SCRATCHES GENERATED WHEN POLISHING METAL FILM BY USING SAME

(71) Applicant: DONGJIN SEMICHEM CO., LTD., Seo-gu, Incheon (KR)

(72) Inventors: Chang Yong Park, Yongin-si (KR); Jong Dai Park, Seoul (KR); Jong Chul Shin, Hwaseong-si (KR); Jae Hyun Kim, Seoul (KR); Goo Hwa Lee, Daegu (KR); Min Sung Park, Seoul (KR)

(73) Assignee: DONGJIN SEMICHEM CO., LTD., Incheon (KR)

( * ) Notice: Subject to any disclaimer, the term of this patent is extended or adjusted under 35 U.S.C. 154(b) by 0 days.

(21) Appl. No.: 15/030,981

(22) PCT Filed: Oct. 21, 2014

(86) PCT No.: PCT/KR2014/009871
§ 371 (c)(1),
(2) Date: Apr. 21, 2016

(87) PCT Pub. No.: WO2015/060610
PCT Pub. Date: Apr. 30, 2015

(65) Prior Publication Data
US 2016/0247693 A1 Aug. 25, 2016

(30) Foreign Application Priority Data

Oct. 23, 2013 (KR) ........................ 10-2013-0126600

(51) Int. Cl.
*H01L 21/321* (2006.01)
*C09K 3/14* (2006.01)
*C09G 1/02* (2006.01)
*H01L 21/768* (2006.01)

(52) U.S. Cl.
CPC ............ *H01L 21/3212* (2013.01); *C09G 1/02* (2013.01); *C09K 3/1463* (2013.01); *H01L 21/7684* (2013.01)

(58) Field of Classification Search
CPC ... H01L 21/3212; H01L 21/7684; C09G 1/02; C09K 3/1463
See application file for complete search history.

(56) References Cited

U.S. PATENT DOCUMENTS

| | | | | |
|---|---|---|---|---|
| 2006/0216939 | A1* | 9/2006 | Uchida | C09G 1/02 438/692 |
| 2011/0039412 | A1* | 2/2011 | Park | C09G 1/02 438/693 |
| 2012/0028466 | A1* | 2/2012 | McConnell | B24B 37/044 438/692 |
| 2013/0029489 | A1* | 1/2013 | Suzuki | B24B 37/044 438/693 |

FOREIGN PATENT DOCUMENTS

KR 10-2005-0120816 A 12/2005

OTHER PUBLICATIONS

International Preliminary Report on Patentability issued in International Application No. PCT/KR2014/009871.

* cited by examiner

*Primary Examiner* — Duy Vu N Deo
(74) *Attorney, Agent, or Firm* — Nath, Goldberg & Meyer; Tanya E. Harkins; Joshua B. Goldberg

(57) ABSTRACT

The present invention relates to a slurry composition for reducing scratches generated when polishing the metal film in a manufacturing process of a semiconductor integrated circuit, by lowering frictional force so that a temperature of the composition which may rise during the polishing is lowered, the thermal stability of the slurry is improved and the size increase of particles in the slurry is suppressed, and a method for reducing scratches using the same. The method comprises the steps of applying a slurry composition for polishing a metal film to a substrate on which the metal film is formed, the slurry composition containing an organic solvent including a nitrogen atom and a glycol-based organic solvent; and making a polishing pad to be contacted to the substrate and moving the polishing pad with respect to the substrate, thereby removing at least part of the metal film from the substrate.

8 Claims, No Drawings

METAL FILM POLISHING SLURRY COMPOSITION, AND METHOD FOR REDUCING SCRATCHES GENERATED WHEN POLISHING METAL FILM BY USING SAME

TECHNICAL FIELD

The present invention relates to a slurry composition for polishing a metal film, and more particularly to a slurry composition for reducing scratches generated when polishing the metal film in a manufacturing process of a semiconductor integrated circuit, by abating frictional force so that a temperature of the composition which may rise during the polishing is lowered, the thermal stability of the slurry is improved and the size increase of particles in the slurry is suppressed, and a method for reducing the scratches generated when polishing the metal film by using the same.

BACKGROUND ART

An integrated semiconductor chip includes a large number of electrical elements, such as transistors, capacitors, resistors and so on, and the electrical elements are connected with wirings of certain patterns to form functional circuits. The size of the integrated semiconductor chip becomes smaller and the functionality thereof becomes being magnified over several generations. However, there is an inherent limitation in reducing the size of the electrical elements. Thus, a multilevel interconnection technology of the electrical elements has been actively studied and developed. Thus, in order to manufacture the semiconductor device with the multilevel interconnection, the planarization process of metal film should be carried out. Generally it is not easy to polish the metal film because of the metal film having high strength, therefore for effectively polishing the metal film, the metal film is transformed to metal oxide which has relatively low strength and then is polished. In the process of polishing the metal film, it is necessary to suppress damage (scratch occurs, etc.) to an insulating film such as a silicon oxide film.

WO 2007-029465 discloses a polishing compound, a method for polishing surface to be polished and a process for producing semiconductor integrated circuit. The polishing compound comprises abrasive grains, one or more polishing rate controlling agents such as benzotriazoles, an organic solvent having a relative dielectric constant of 15-80, a boiling point of 60-250° C., and a viscosity of 0.5-60 mPa·s at 25° C., and water. In the above-mentioned reference, the pH of slurry is different from that in the present invention and mixture of at least two organic solvents is used. Korean Unexamined Publication No. 10-2012-124395 discloses an aqueous electrolyte solution containing citric acid and ammonium hydrogen fluoride. in the above Korean reference, a method for removing the metal surface, an used catalyst, an oxidizer and a dispersing agent are different, and the metal film is removed by etching with an electrolytic solution not polishing. Japanese Unexamined Publication No. 2000-254867 discloses a polishing sheet containing a mixing solvent consisting of at least two components, wherein the boiling point of each component is different to each other. The Japanese Unexamined Publication No. 2000-254867 is different from the present invention in view of the intended purpose and kinds of solvent used, is silent to amount of solvent and is related but to the polishing sheet not slurry composition.

DISCLOSURE

Technical Problem

An object of the present invention is to provide a slurry composition for reducing scratches generated when polishing the metal film and a method for reducing the scratches generated when polishing the metal film by using the same, by lowering a frictional force so that a temperature of the composition which may rise during the polishing is lowered and the thermal stability of the slurry is improved.

Technical Solution

In an embodiment for achieving the objects, the present invention provides a method for reducing scratches generated when polishing the metal film, comprising: applying a slurry composition for polishing a metal film to a substrate on which the metal film is formed, the composition containing an organic solvent including nitrogen atoms and a glycol-based organic solvent; and making a polishing pad to be contacted to the substrate and moving the polishing pad with respect to the substrate, thereby removing at least part of the metal film from the substrate.

In addition, the present invention provides a slurry composition for polishing a metal film, comprising: 0.001 to 10 weight % of an abrasive; 0.00001 to 0.1 weight % of a catalyst; 0.1 to 10 weight % of an oxidizer; 0.1 to 10 weight % of an organic solvent containing nitrogen atoms; 0.1 to 50 weight % of a glycol-based organic solvent; and remaining water, and wherein a mixing ratio of the organic solvent containing nitrogen atoms and glycol-based organic solvent is 1:1 to 1:500 by weight.

Technical Effects

In the slurry composition for polishing a metal film and the method for reducing the scratches generated when polishing the metal film by using the same according to the present invention, a solvent mixture containing at least two kinds of organic solvents is included in the slurry composition, so that stability of the abrasive is improved, a frictional force between a polishing pad and a wafer is reduced during the chemical mechanical polishing (CMP) process, and then the temperature of the solvent, which may be possibly increased, is lowered. In addition, the solvent mixture containing at least two kinds of organic solvents each having different boiling point raises its boiling point by attraction between the solvents. Further, the present invention lowers the solvent temperature as well as improves the thermal stability of the slurry composition to suppress the size increase of particles in the slurry composition at high temperature, thereby reducing the scratches generated on silicon oxide (substrate) when polishing the metal film.

EXAMPLES

A more complete appreciation of the invention, and many of the attendant advantages thereof, will be better appreciated by reference to the following detailed description.

A method for reducing scratches generated when polishing the metal film according to the present invention, comprises: applying a slurry composition for polishing a metal film, containing an organic solvent including nitrogen atoms and a glycol-based organic solvent, to a substrate on which the metal film is formed; and making a polishing pad to be contacted to the substrate and moving the polishing pad with respect to the substrate, thereby removing at least part of the metal film from the substrate.

The slurry composition for polishing a metal film, comprises an abrasive, a catalyst, an oxidizer, an organic solvent containing nitrogen atoms, a glycol-based organic solvent, and remaining water, and if desired, further comprises a pH control agent. By the high-speed rotation of the polishing pad, the slurry composition is uniformly applied on top of the polishing pad, and at the same time, is in contact with the surface of the substrate on which the metal film is formed. Then a polishing device makes the polishing pad be moved with respect to the substrate with being contact with the surface of the substrate, thereby the surface of the substrate is oxidized and polished. When a part of the surface of the substrate is sufficiently polished with such a process, the polishing device lays outwardly away the substrate polished and makes a subsequent substrate to be polished be placed under the pad, and by repeating the above process the polishing work is performed. On the other hand, since the surface of the polishing pad is worn by continuous polishing, the surface of the polishing pad must be ground for the reuse (for subsequent polishing process). In detail, the surface of the polishing pad is ground by rotating the polishing pad while supplying the slurry composition.

In a manufacturing process of a semiconductor integrated circuit, specifically in polishing a composite film containing a metal film and a silicon oxide film, the method according to the present invention can effectively polish the metal film while suppressing the generation of scratches on the silicon oxide film. In the present invention, an organic solvent including nitrogen atoms and a glycol-based organic solvent which are different in boiling point, are mixed in a suitable ratio. Therefore, the boiling point of the slurry composition rises due to the attraction between both solvents and the frictional force between the polishing pad and the wafer is reduced by non-ionic surfactants of the glycol-based organic solvent in a CMP (Chemical Mechanical Polishing) process, thereby reducing the temperature of the solvents. The physical absorption to and the electrostatic force between polishing particles, resulted from the organic solvent containing the nitrogen atoms, increase zeta potential of the particles thereby improving the thermal stability of the abrasives. In the conventional art, the size of particles in the slurry composition is increased by high temperature generated in using the conventional metal polishing slurry composition and thereby a large of amount of scratches are generated. However, unlike the conventional art, in the present invention the temperature of the solvent used is reduced, which improves the thermal stability of the slurry composition and suppresses the size increasing of the particles in the slurry composition by reducing the temperature of the solvent used, and accordingly, the scratches generated on the silicon oxide film are reduced.

The slurry composition according to the present invention is for reducing the scratches generated on the silicon oxide film while effectively polishing the metal film. The slurry composition comprises 0.001 to 10 weight % of an abrasive, 0.00001 to 0.1 weight % of a catalyst, 0.1 to 10 weight % of an oxidizer, 0.1 to 10 weight % of an organic solvent containing nitrogen atoms, 0.1 to 50 weight % of a glycol-based organic solvent; and remaining water. The mixing ratio of the organic solvent containing nitrogen atoms and glycol-based organic solvent is 1:1 to 1:500 by weight. Also, the slurry composition may further comprise the pH control agent, as needed.

The abrasive used in the present invention is for physically polishing the metal film. Examples of the abrasive include, without limitation, silica such as fumed silica, colloidal silica and so on, alumina, ceria, titania, zirconia (zirconium oxide), gennania and mixtures thereof and silica is most preferable. The amount of the abrasives is 0.001 to 10 weight %, preferably 0.01 to 10 weight %, more preferably 0.1 to 5 weight %, with respect to total slurry composition. If the amount of the abrasive is too much, the metal film and the silicon oxide film may be excessively scratched, and if the amount of the abrasive is too little, the polishing rate (removal rate) of the metal film may be reduced.

The catalyst is a non-ionized thermally-activated catalyst, for emitting electrons and holes by energy generated in the metal film polishing process. The electrons emitted from the catalyst reacts with the oxidizer such as hydrogen peroxide to generate hydroxyl radicals. The catalyst includes transition metal silicides such as ferrosilicon (FeSi), manganese silicide (MnSi), cobalt silicide (CoSi), and mixtures thereof, preferably nano FeSi. In using FeSi, amount of Fe is 0.01 to 99 weight %, preferably 0.1 to 50 weight % with respect to total FeSi. If the amount of Fe is too little, the catalyst may not be activated by the polishing process energy, and if the amount of Fe is too much, the catalyst may become a conductor to lose a catalyst function. The nano FeSi catalyst has nano-scaled particle size and in detail has particles of 1 to 1,000 nm, preferably 1 to 20 nm, more preferably 2 to 10 nm. If the particle size of the nano FeSi catalyst is too small, the particles may not be formed, and if the particle size of the nano FeSi catalyst is too large, the catalyst activation may be lowered or defects such as scratches may be generated in the polishing process. The amount of the nano FeSi catalyst is 0.00001 to 0.1 weight % (0.1 to 1000 ppm), preferably 0.001 to 0.05 weight % with respect to total slurry composition. If the used amount of the catalyst is too little, the polishing rate of the metal film may be lowered, and if the amount of the catalyst is too much, its reactivity is excessively increased to make the polishing rate un-uniform. The FeSi catalyst is detail disclosed in Korean Patent No. 10-0928456 belonging to the present applicant, which is incorporated herein by reference.

The oxidizer used for the present metal film polishing slurry composition is for rapidly forming an oxide film on the metal film to facilitate the metal film polishing. As the oxidizer, a conventional oxidizer which is used in the metal film polishing slurry composition can be used without limitation, preferably inorganic or organic per-compound may be used. The per-compound means a compound comprising at least one hydroperoxide group (—O—O—) or a compound having an element which is in its highest oxidation state. In detail, as the oxidizer include, hydrogen peroxide ($H_2O_2$), urea hydrogen peroxide, mono persulfate, dipersulfate, peracetic acid, percarbonate, benzoyl peroxide, periodic acid, sodium periodate, perbromic acid, perboric acid, sodium perborate, perchloro acid, sodium perchlorate, permanganate, sodium permanganate can be used alone and mixture thereof can be used, and hydrogen peroxide is preferable. The oxidizer oxidizes the metal film on the wafer or the substrate with the corresponding oxide, hydroxide, ions. The amount of oxidizer used is 0.1 to 10 weight %, preferably 0.2 to 5 weight % with respect to total slurry composition. If the amount of the oxidizer is too little, the polishing rate of the metal film may be lowered, and if the amount of the oxidizer is too much, the polishing efficiency may be degraded.

The organic solvent used in the present invention is a mixture of at least two kinds of solvents such as an organic solvent containing nitrogen atoms and a glycol-based organic solvent. The organic solvent of the present invention reduces the scratches on the silicon oxide film by reducing the frictional force as well as improves its dispersion stability and thermal stability by maximum suppressing the particle growth caused by heat generated from the storage temperature and the CM process.

Any organic solvent containing the nitrogen atoms can be used without limitation, and preferably amide compound, imide compound, amine compound and imine compound can be used alone and mixture thereof can be used.

The examples of the amide compound include acrylamide, 2-propenamide and sulfonamide, and among them acrylamide is preferable. The examples of the imide compound include succinimide and phthalimide, and phthalimide is preferable. The examples of the amine organic solvent include trimethyl amine, triethyl amine, tripropyl amine, tributyl amine, tripentyl amine, trihexyl amine, triheptyl amine, trioctyl amine and tridecyl amine and so on, and among them tributyl amine is preferable. The examples of imine compound include ethyleneimine and N-sulfonylimine and so on.

Further, as the glycol-based organic solvent, monoethylene glycol, diethylene glycol, triethylene glycol can be used alone and mixture thereof can be used, and diethylene glycol is preferable.

The amount of the organic solvent containing the nitrogen atoms is 0.1 to 10 weight %, preferably 0.1 to 5 weight %, more preferably 0.1 to 2 weight %, with respect to total slurry composition. The amount of the glycol-based organic solvent is 0.1 to 50 weight %, preferably 0.1 to 30 weight %, more preferably 0.1 to 10 weight % with respect to total slurry composition.

The organic solvent containing nitrogen atoms and the glycol-based organic solvent are mixed in an appropriate ratio, 1:1 to 1:500 by weight, preferably 1:1 to 1:300 by weight, more preferably 1:1 to 1:100 by weight. If the use amount of the organic solvent containing nitrogen atoms and the glycol-based organic solvent is too little, storage stability at high temperature may be lowered. If the use amount of the organic solvent containing nitrogen atoms and the glycol-based organic solvent is too much, CMP feature may be degraded. That is, when the mixture ratio of the organic solvent containing nitrogen atoms and the glycol-based organic solvent is in range of 1:1 to 1:500 by weight, stability of solvent is improved to reduce the number of scratches, however when the mixture ratio is out of the range, CMP feature is excessively degraded and accordingly the scratch-reduction effect may be lowered.

The remaining component constituting the metal film polishing slurry composition according to the invention is water, which includes deionized water and distilled water, etc. The amount of water is, for example, 36 to 97%. In addition, to the extent to achieve the objects and effects of the invention, the metal film polishing slurry composition according to the invention may further comprise other conventional additives. The slurry composition according to the present invention can be prepared by any known method. For example, the component of an abrasive, a catalyst, an oxidizer, an organic solvent each may be added to the aqueous medium such as deionized water, distilled water, etc. (which is hereinafter, simply referred to as "water" at need) with a concentration required. The pH of the the metal film polishing slurry composition according to the invention is 1 to 7, preferably 1 to 4, and if the pH of the slurry composition is too high, the oxide film is not formed sufficiently to possibly reduce the polishing rate.

The pH control agent which may further be included as need is for controlling the dispersion stability of the abrasive by controlling the pH of the metal film polishing slurry composition and makes the pH of the slurry composition be in 1 to 7, preferably 1 to 4. Any pH control agent used for the conventional metal film polishing slurry composition can be used regardless of the limitation (acids, bases), and for example acids and bases can be used alone or in mixing form, wherein the acids include sulfuric acid, hydrochloric acid, phosphoric acid, nitric acid, tartaric acid, citric acid, oxalic acid and benzoic acid, and the bases include ammonia, potassium hydroxide, tetramethylammonium hydroxide (TMAH), tetramethylammonium hydroxide (TMAH), tetrabutylammonium hydroxide (TBAH).

If the pH of the metal film polishing slurry composition is out of the above-mentioned range, the dispersity of the abrasive may be lowered so that the polishing is insufficiently preformed. The amount of the pH control agent, which may vary depending on the pH of the metal film polishing slurry composition, is for example 0.05 to 10 weight %, preferably 0.1 to 5 weight %, more preferably 0.3 to 2 weight % with respect to the total slurry composition. If the amount of the pH control agent is out of the range, it is difficult to control the pH of the metal film polishing slurry composition and the pH control agent may act as impurities.

EXAMPLES

Hereinafter, the preferable examples are provided for better understanding of the present invention. However, the present invention is not limited by the following examples.

[Examples 1~10, Comparative Examples 1~2]
Manufacturing the Slurry Composition

Components shown in following Table 1 were mixed at room temperature, and stirred by a mechanical stirrer to prepare the slurry compositions (Examples 1 to 10, Comparative Examples 1 and 2).

TABLE 1

|  | abrasive (silica, weight %) | oxidizer ($H_2O_2$, weight %) | Water (weight %) | Organic solvent(weight %) | | Nano FeSi (ppm) |
| --- | --- | --- | --- | --- | --- | --- |
|  |  |  |  | Tributyl amine | Diethylene glycol |  |
| Example 1 | 2 | 1.5 | 96.3 | 0.1 | 0.1 | 60 |
| Example 2 | 2 | 1.5 | 95.4 | 0.1 | 1 | 60 |
| Example 3 | 2 | 1.5 | 86.4 | 0.1 | 10 | 60 |
| Example 4 | 2 | 1.5 | 76.4 | 0.1 | 20 | 60 |
| Example 5 | 2 | 1.5 | 66.4 | 0.1 | 30 | 60 |
| Example 6 | 2 | 1.5 | 86.0 | 0.5 | 10 | 60 |
| Example 7 | 2 | 1.5 | 76.0 | 0.5 | 20 | 60 |
| Example 8 | 2 | 1.5 | 66.0 | 0.5 | 30 | 60 |
| Example 9 | 2 | 1.5 | 56.0 | 0.5 | 40 | 60 |

TABLE 1-continued

|  | abrasive (silica, weight %) | oxidizer (H$_2$O$_2$, weight %) | Water (weight %) | Organic solvent(weight %) Tributyl amine | Diethylene glycol | Nano FeSi (ppm) |
|---|---|---|---|---|---|---|
| Example 10 | 2 | 1.5 | 46.0 | 0.5 | 50 | 60 |
| Comparative Example 1 | 2 | 1.5 | 96.5 | 0 | 0 | 60 |
| Comparative Example 2 | 2 | 1.5 | 36.4 | 0.1 | 60 | 60 |

Removal Rate of Tungsten Film, the Number of Scratches Formed on the Silicon Oxide Film and the Temperature of the Polishing Pad Tungsten (W) film of 8 inches (blanket wafer) was loaded on Mirra 3400 of polisher (Applied Materials, Inc.) on which IC-1010 of polishing pad (Rohm & Haas Co. Ltd.) was mounted. Next the tungsten film was polished for 60 seconds while supplying the slurry compositions of the Examples 1 to 10 and the Comparative Examples 1 and 2 to the wafer. The polishing conditions were listed on following Table 2. In the following Table 2, IC pressure, RR pressure, EC pressure, UC pressure each represents Inter Chamber Pressure, Retainer Ring Pressure, External Chamber Pressure, Upper Chamber Pressure, which shows the pressure condition in respective part of Head on which the wafer was mounted.

TABLE 2

| Platen rate | Head rate | IC pressure | RR pressure | EC pressure | UC pressure | Slurry flow rate |
|---|---|---|---|---|---|---|
| 85 rpm | 70 rpm | 2.5 psi | 10.4 psi | 5.2 Psi | 5.2 psi | 150 ml/min |

Removal Rate of tungsten film (Angstrom (Å)/min, hereinafter, referred to as R/R) measured by using a resistance measuring instrument (CMT-2000, 4-point probe, Chang-min Tech Co., Ltd.), the number of the scratches formed on a PETEOS (Plasma Enhanced-Tetra Ethyl Ortho Silicate) film measured by using KLA of scratch measurement equipment (TENCOR Co. Ltd.) after polishing the blanket wafer of 8-inches-PETEOS (Plasma Enhanced-Tetra Ethyl Ortho Silicate), a frictional force measured by using a polisher (G&P technology, Poli 500 Polisher), and a temperature of polishing pad measured by using an infrared thermometer (Seoho Inc.) are shown in following Table 3.

TABLE 3

|  | Removal rate of tungsten film (Å/min) | Number of scratches | Temperature of polishing pad (° C.) | Frictional force (kgf) |
|---|---|---|---|---|
| Example 1 | 3140 | 10 | 49 | 26.5 |
| Example 2 | 3167 | 7 | 50 | 26.7 |
| Example 3 | 3087 | 8 | 49 | 26.8 |
| Example 4 | 3094 | 9 | 50 | 26.1 |
| Example 5 | 3019 | 13 | 50 | 26.5 |
| Example 6 | 2947 | 11 | 49 | 26.9 |
| Example 7 | 2975 | 10 | 49 | 26.4 |
| Example 8 | 3108 | 2 | 48 | 25.3 |
| Example 9 | 3142 | 4 | 48 | 25.2 |
| Example 10 | 2973 | 11 | 50 | 25.5 |
| Comparative Example 1 | 3184 | 18 | 52 | 27.5 |
| Comparative Example 2 | 3085 | 21 | 52 | 24.2 |

As shown in Table 3, the number of the scratches is decreased 30 to 90% depending on a mixing ratio of an organic solvent containing nitrogen atoms (an amine-based organic solvent) and a glycol-based organic solvent. In general, it can be seen that when the friction force is lowered, the temperature of the polishing pad is decreased simultaneously. In other words, comparing the Comparative Examples and the Examples of the present inventions, the number of the scratches, the friction, the temperature of the polishing pad varies depending on the mixing ratio of two organic solvents. The metal film polishing slurry composition of the present invention makes the temperature of the polishing pad down as well as reduces the number of the scratches.

Storage Stability of the Slurry Composition at High Temperature According to the Mixing Ratio of Two Organic Solvents The slurry compositions of Examples 1 to 10 and Comparative Example 1 each having a different mixing ratio of the organic solvent containing nitrogen atoms and the glycol-based organic solvent, were stored at high temperature of 60° C. The particle size changes in the slurry compositions over times are shown in following Table 4.

TABLE 4

|  | Test day | After 1 week | After 2 weeks | After 3 weeks | After 4 weeks | Zeta potential (mV) |
|---|---|---|---|---|---|---|
| Example 1 | 65 nm | 69 nm | 76 nm | 84 nm | 90 nm | 15.3 |
| Example 2 | 65 nm | 72 nm | 77 nm | 88 nm | 93 nm | 16.2 |
| Example 3 | 65 nm | 68 nm | 75 nm | 79 nm | 85 nm | 16.5 |
| Example 4 | 65 nm | 70 nm | 74 nm | 86 nm | 97 nm | 15.9 |
| Example 5 | 65 nm | 68 nm | 73 nm | 90 nm | 101 nm | 16.5 |
| Example 6 | 65 nm | 67 nm | 72 nm | 85 nm | 94 nm | 16.1 |
| Example 7 | 65 nm | 69 nm | 73 nm | 84 nm | 92 nm | 16.9 |
| Example 8 | 65 nm | 65 nm | 66 nm | 67 nm | 70 nm | 16.8 |
| Example 9 | 65 nm | 67 nm | 68 nm | 71 nm | 75 nm | 15.7 |
| Example 10 | 65 nm | 71 nm | 86 nm | 98 nm | 105 nm | 16.4 |

TABLE 4-continued

| | Test day | After 1 week | After 2 weeks | After 3 weeks | After 4 weeks | Zeta potential (mV) |
|---|---|---|---|---|---|---|
| Comparative Example 1 | 66 nm | 71 nm | 100 nm | 155 nm | 215 nm | 2.4 |

As shown in Table 4, the addition of the organic solvent having nitrogen atoms and the glycol-based organic solvent increases zeta potential of particles so that the particle size is not increased and is stabilized (that is, improvement of the stability of the abrasives caused by zeta potential increase). Further, the slurry compositions in Examples 1 to 10 and Comparative Example 1 in which the organic solvent having nitrogen atoms and the glycol-based organic solvent are mixed in an optimized ratio, show high storage stability at high temperature.

[Examples 11~14] Preparation of the Slurry Composition

Components shown in Table 5 were mixed at room temperature and then stirred to prepare the slurry compositions (Examples 11 to 14).

TABLE 5

| | Abrasive (silica, weight %) | Oxidizer ($H_2O_2$, weight %) | Water (weight %) | Organic solvent(weight %) | | | Nano FeSi (ppm) |
|---|---|---|---|---|---|---|---|
| Example 11 | 2 | 1.5 | 66 | acrylamide 0.5 | ethylene-glycol 30 | | 60 |
| Example 12 | 2 | 1.5 | 66 | phthalimide 0.5 | ethylene-glycol 30 | | 60 |
| Example 13 | 2 | 1.5 | 66 | tributyl amine 0.5 | diethylene-glycol 10 | ethylene-glycol 20 | 60 |
| Example 14 | 2 | 1.5 | 56 | acrylamide 0.1 | diethylene-glycol 40 | tributyl amine 0.1 | 60 |

Removal Rate of Tungsten Film, the Number of Scratches Formed on the Silicon Oxide Film and the Temperature of the Polishing Pad Removal Rate of tungsten film (Angstrom (Å)/min, hereinafter, referred to as R/R) measured by using a resistance measuring instrument (CMT-2000, 4-point probe, Changmin Tech Co., Ltd.), the number of the scratches formed on a PETEOS (Plasma Enhanced-Tetra Ethyl Ortho Silicate) film measured by using a KLA scratch measurement equipment (TENCOR Co.) after polishing a blanket wafer of 8-inches-PETEOS (Plasma Enhanced-Tetra Ethyl Ortho Silicate), frictional force measured by using a polisher (G&P technology, Poli 500 Polisher), temperature of the polishing pad measured by using an infrared thermometer (Seoho Inc.) are shown in following Table 6.

TABLE 6

| | Removal rate of tungsten film (Å/min) | Number of scratches | Temperature of polishing pad (° C.) | Frictional force (kgf) |
|---|---|---|---|---|
| Example 11 | 3084 | 8 | 50 | 26.1 |
| Example 12 | 2958 | 10 | 49 | 26.7 |
| Example 13 | 2906 | 13 | 49 | 26.3 |
| Example 14 | 3031 | 11 | 50 | 26.4 |

As shown in Table 6, even in case of mixing at least two kinds of one organic solvent among the organic solvent containing nitrogen atoms and the glycol-based organic solvent, the number of the scratches is decreased, the friction force is lowered, and the temperature of the polishing pad is decreased simultaneously. In other words, comparing the Comparative Examples and the Examples of the present inventions, the number of the scratches, the friction, the temperature of the polishing pad varies depending on the mixing ratio of two organic solvents. The metal film polishing slurry composition of the present invention makes the temperature of the polishing pad down as well as reduces the number of the scratches.

Storage Stability of the Slurry Composition at High Temperature According to the Mixing Ratio of Two Organic Solvents The slurry compositions of Examples 11 to 14 each having a different mixing ratio of the organic solvent containing nitrogen atoms and the glycol-based organic solvent, were stored at high temperature of 60° C. The particle size changes in the slurry compositions over times are shown in following Table 7.

TABLE 7

| | Test day | After 1 week | After 2 weeks | After 3 weeks | After 4 weeks | Zeta potential (mV) |
|---|---|---|---|---|---|---|
| Example 11 | 65 nm | 68 nm | 76 nm | 83 nm | 92 nm | 16.1 |
| Example 12 | 65 nm | 69 nm | 78 nm | 85 nm | 93 nm | 16.5 |
| Example 13 | 65 nm | 68 nm | 79 nm | 82 nm | 88 nm | 16.7 |
| Example 14 | 65 nm | 70 nm | 78 nm | 84 nm | 91 nm | 16.3 |

A shown in Table 7, the addition of the organic solvent having nitrogen atoms and the glycol-based organic solvent increases zeta potential of particles so that the particle size is not increased and is stabilized (that is, improvement of the stability of the abrasives caused by zeta potential increase). Further, the slurry compositions in Examples 11 to 14 in which the organic solvent having nitrogen atoms and the glycol-based organic solvent are mixed in an optimized ratio, show high storage stability of the composition at high temperature.

The invention claimed is:

1. A method for reducing scratches generated when polishing a metal film, comprising:
   applying a slurry composition for polishing the metal film, the metal film being formed on a substrate, the slurry composition containing an organic solvent including nitrogen atoms and a glycol-based organic solvent in a ratio the organic solvent containing nitrogen and the glycol-based organic solvent is 1:1 to 1:100 by weight;
   making a polishing pad to be contacted to the substrate; and
   moving the polishing pad with respect to the substrate, thereby removing at least part of the metal film from the substrate;
   wherein the glycol-based organic solvent is selected from the group consisting of diethylene glycol, triethylene glycol, and mixtures thereof; the organic solvent containing nitrogen atoms is selected from the group consisting of phthalimide, tripropylamine, tributylamine, tripentylamine, trihexylamine, triheptyl amine, trioctylamine, and tridecylamine; and the glycol-based organic solvent and the organic containing nitrogen atoms each have a different boiling point.

2. A slurry composition for polishing a metal film, comprising:
   0.001 to 10 weight % of an abrasive; 0.00001 to 0.1 weight % of a catalyst;
   0.1 to 10 weight % of an oxidizer;
   0.1 to 10 weight % of an organic solvent containing nitrogen atoms selected from the group consisting of phthalimide, tripropylamine, tributylamine, tripentylamine, trihexylamine, triheptyl amine, trioctylamine, and tridecylamine;
   0.1 to 50 weight % of a glycol-based organic solvent selected from the group consisting of diethylene glycol, triethylene glycol, and mixtures thereof; and remaining water,
   wherein a mixing ratio of the organic solvent containing nitrogen atoms and the glycol-based organic solvent is 1:1 to 1:100 by weight; and the organic solvent containing nitrogen atoms and the glycol-based organic each have a different boiling point.

3. The slurry composition of claim 1, wherein the abrasive is selected from the group consisting of silica, alumina, ceria, titania, zirconia (zirconium oxide), gennania, and mixtures thereof.

4. The slurry composition of claim 1, wherein the catalyst is a transition metal silicide selected from the group consisting of FeSi, MnSi, CoSi and mixtures thereof.

5. The slurry composition of claim 1, wherein the oxidizer is selected from the group consisting of hydrogen peroxide ($H_2O_2$), urea hydrogen peroxide, mono persulfate, dipersulfate, peracetic acid, percarbonate, benzoyl peroxide, periodic acid, sodium periodate, perbromic acid, perboric acid, sodium perborate, perchloro acid, sodium perchlorate, permanganate, sodium permanganate and mixtures thereof.

6. The slurry composition of claim 1, further comprising a pH control agent.

7. The slurry composition of claim 6, wherein the pH control agent maintains the slurry composition at a pH of 1 to 7.

8. The composition of claim 6, wherein the pH control agent is selected from the group consisting of acids, bases and mixture thereof,
   wherein the acids are selected from sulfuric acid, hydrochloric acid, phosphoric acid, nitric acid, tartaric acid, citric acid, oxalic acid and benzoic acid, and
   wherein the bases are selected from ammonia, potassium hydroxide, tetramethylammonium hydroxide (TMAH), tetramethylammonium hydroxide (TMAH), tetrabutylammonium hydroxide (TBAH).

* * * * *